(12) United States Patent
Adachi et al.

(10) Patent No.: US 6,737,589 B2
(45) Date of Patent: May 18, 2004

(54) FLEXIBLE PRINTED WIRING BOARD (75) Inventors: Takao Adachi, Chita (JP); Kazuyoshi Inoue, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/308,212

(22) Filed: Dec. 2, 2002

(65) Prior Publication Data

US 2003/0116343 A1 Jun. 26, 2003

(30) Foreign Application Priority Data

Dec. 10, 2001 (JP) .................................. 2001-376322

(51) Int. Cl.⁷ ................................................ H05K 7/06
(52) U.S. Cl. ...................... 174/254; 174/255; 174/257; 174/258; 174/259; 174/261
(58) Field of Search .................. 361/777, 780, 361/792–795, 749–751; 174/250, 254–258, 261, 259; 333/12, 33, 185, 246, 247

(56) References Cited

U.S. PATENT DOCUMENTS

| 4,498,122 A | * | 2/1985 | Rainal ........................ 361/794 |
| 4,864,722 A | * | 9/1989 | Lazzarini et al. ............. 29/830 |
| 5,101,323 A | * | 3/1992 | Prevost ....................... 361/730 |
| 5,136,123 A | * | 8/1992 | Kobayashi et al. ......... 174/258 |
| 5,285,018 A | * | 2/1994 | Pence, IV .................... 174/261 |
| 5,633,479 A | * | 5/1997 | Hirano ........................ 174/255 |
| 5,682,124 A | * | 10/1997 | Suski ............................. 333/1 |
| 5,771,158 A | * | 6/1998 | Yamagishi et al. .......... 361/777 |
| 5,800,650 A | * | 9/1998 | Anderson et al. ............ 156/150 |
| 5,844,783 A | * | 12/1998 | Kojima ........................ 361/777 |
| 6,049,041 A | * | 4/2000 | Yoshioka et al. ....... 174/117 FF |
| 6,495,770 B2 | * | 12/2002 | Li et al. ....................... 174/255 |
| 2002/0189854 A1 | * | 12/2002 | Crumly ....................... 174/254 |

* cited by examiner

Primary Examiner—John B. Vigushin
(74) Attorney, Agent, or Firm—Burr & Brown

(57) ABSTRACT

A flexible printed wiring board is provided, including a flexible electrically insulating polyimide substrate, first and second electrically conductive patterns each including conductive strips arranged in parallel with each other on opposed major surfaces, respectively, of the electrically insulating substrate, and first and second flexible electrically insulating polyimide covers cemented to the respective major surfaces of the electrically insulating substrate by first and second electrically insulating adhesive layers by thermocompression bonding such that the first and second conductive patterns are covered with the first and second flexible electrically insulating covers, respectively. The first and second conductive patterns are arranged symmetrically with respect to a geometrical center line or neutral stress line when viewed in the thickness direction of the flexible printed wiring board, or are arranged asymmetrically such that the conductive patterns are deviated toward an inner side of the flexible printed wiring board in a bent condition.

26 Claims, 8 Drawing Sheets

FLEXIBLE PRINTED WIRING BOARD

This application claims the benefit of Japanese Application 2001-376,322, filed Dec. 10, 2001, the entirety of which is incorporated herein by reference.

BACKGROUND OF THE INVENTION

1. Field of the Invention

The present invention relates to a flexible printed wiring board comprising an electrically insulating substrate, a conductive pattern having a plurality of parallel electrically conductive strips serving as signal conductors arranged on a surface of the substrate, and an electrically insulating cover adhered to the surface of the substrate such that the conductive pattern is covered with the electrically insulating cover.

2. Related Art Statements

Flexible printed wiring boards of the kind mentioned above have been used in various applications. For instance, flexible printed wiring boards are provided in camera, duplicating machine, printer and hard disk devices. Nowadays, various types of flexible printed wiring boards have been widely used in cellular phones.

Figure 1:
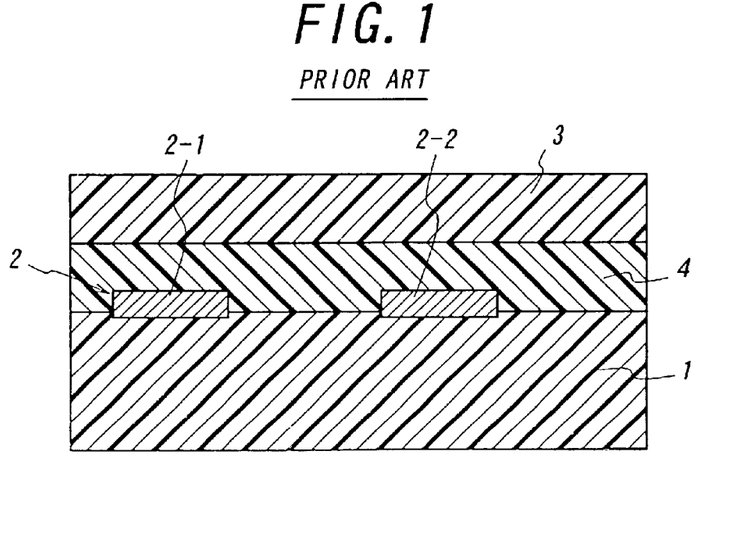
FIG. 1 is a cross sectional view showing a known flexible printed wiring board.

FIG. 1 is a cross sectional view showing a typical structure of a known flexible printed wiring board. On a surface of a flexible insulating substrate 1 is arranged a conductive pattern 2 including a plurality of electrically conductive strips 2-1, 2-2—which are arranged in parallel with each other with a given line width and spacing, the electrically conductive strips serving as signal conductors. An electrically insulating cover 3 is cemented to the substrate by means of an adhesive layer 4 such that the conductive pattern 2 is covered with the electrically insulating cover 3. Each of the conductive strips 2-1, 2-2—of the conductive pattern 2 has a width of, for instance 150–200 μm and the conductive strips are arranged in parallel with each other with a space of, for instance 150–200 μm. In a general manufacturing process of the conductive pattern 2, a copper film is first formed on the substrate by electrolytic plating with a thickness of, for instance 30–40 μm and then the copper film is etched into a given pattern by a photolithography technique.

In the known flexible printed wiring board shown in FIG. 1, a symmetric structure is adopted in order to improve a flexibility, i.e. folding endurance. That is to say, the flexible printed wiring board is constructed such that a center of the conductive pattern 2 including a plurality of conductive strips 2-1, 2-2—is situated at a position which is substantially coincided with a geometrical center of the flexible printed wiring board viewed in a direction of a thickness of the flexible wiring board. It should be noted that the geometrical center may be considered as a neutral stress line of the flexible printed wiring board in a bent or folded condition. For example, when the electrically insulating substrate 1 is made of polyimide and has a thickness of 50 μm, a thickness of the electrically insulating cover 3 is set to 25 μm and a thickness of the adhesive layer 4 is also set to 25 μmm. In many applications, very severe conditions have been imposed upon the folding endurance. For instance, in a flexible printed wiring board for use in a folding type cellular phone, break down of the conductive strip should not occur even after 50,000 times of bending, preferably not even after 100,000 times of bending, and much more preferably not even after 200,000 times of bending. However, the known flexible printed wiring board illustrated in FIG. 1 could not sufficiently satisfy such a severe condition.

When a flexible printed wiring board is used in a communicating machine such as cellular phone, it is required to transmit a higher frequency signal through the flexible printed wiring board in accordance with an increase in a communication speed. In such a high frequency application, in order to transmit a high frequency signal efficiently, accurate impedance matching is required. To this end, successive conductive strips of a conductive pattern are used alternately as signal lines and ground lines. However, in the known flexible printed wiring board shown in FIG. 1, impedance matching could not be attained accurately. In order to effect the impedance matching accurately, the spacing between successive conductive strips of the conductive pattern 2 has to be controlled precisely. However, this control is very difficult. Particularly, in recent cellular phones, it is required to set an impedance within a range of $50\Omega \pm 10\%$, but the impedance of the flexible printed wiring board could not be fit within such a narrow range.

Figure 2:
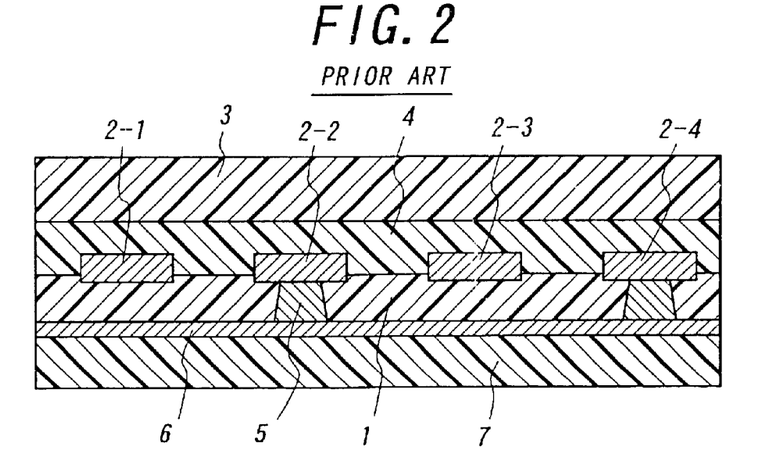
FIG. 2 is a cross sectional view illustrating another known flexible printed wiring board.

FIG. 2 is a cross sectional view depicting another known flexible printed wiring board, in which portions similar to those shown in FIG. 1 are denoted by the same reference numerals used in FIG. 1. Also in this known flexible printed wiring board, conductive strips 2-1, 2-2—having a given line width of a conductive pattern 2 are arranged in parallel with each other at a given spacing on a surface of a flexible electrically insulating substrate 1, and an electrically insulating cover 3 is secured to the surface of the substrate 1 by means of an adhesive layer 4 such that the conductive pattern 2 is covered with the electrically insulating cover 3. The conductive strips 2-1, 2-2—alternately serve assignal lines and ground lines. The conductive strips 2-1, 2-3, 2-5—serving as signal lines are independent form each other, but the conductive strips 2-2, 2-4, 2-6—serving as ground lines are commonly connected to a ground sheet or earth sheet 6 by means of vias 5 formed by embedding an electrically conductive material in via holes formed in the electrically insulating substrate 1. The ground sheet 6 is covered with an electrically insulating cover 7. This type flexible printed wiring board is disclosed in a Japanese Patent Specification No. 2,549,213.

In the conventional flexible printed wiring board illustrated in FIG. 2, since the ground sheet 6 is arranged below the signal lines, precise impedance matching can be performed. However, the structure is rather complicated and the manufacturing process is also cumbersome, and the cost is liable to be high. Moreover, a decrease in life time due to repeated bending is large, and the flexible printed wiring board could not be used for applications in which a folding endurance should be maintained after more than several tens of thousands times of bending.

In the known flexible printed wiring boards illustrated in FIGS. 1 and 2, the conductive strips 2-1, 2-2, 2-3—arranged on the same plane are used alternately as signal lines and ground lines, and thus a utilization efficiency of a surface area of the flexible printed wiring board for the signal transmission is low. Due to the high performance of electronic devices, the amount of signal to be transmitted through the flexible printed wiring board becomes larger and larger. However, in the known flexible printed wiring boards shown in FIGS. 1 and 2, if the number of conductive strips is increased, the width of the wiring boards has to be larger and a high density package could not be attained. Alternatively, if the number of flexible printed wiring boards to be used is increased, the whole structure becomes large and complicated and the cost is increased. Moreover, the folding endurance becomes lower and the flexible printed wiring boards could not be used in applications in which the folding endurance should not be lost after several tens of thousands times of bending.

SUMMARY OF THE INVENTION

The present invention has for its object to provide a novel and useful flexible printed wiring board, in which the impedance matching can be attained easily and precisely without decreasing the amount of signal to be transmitted and without lowering the folding endurance, while the flexible printed wiring board can be manufactured in a simple and less expensive manner.

It is another object of the invention to provide a flexible printed wiring board in which impedance matching can be attained easily and precisely without deceasing the amount of signal to be transmitted and having a folding endurance that is higher than the known flexible printed wiring boards.

According to one aspect of the present invention, a flexible printed wiring board is provided, including a flexible electrically insulating substrate having first and second major surfaces, a first electrically conductive pattern including a plurality of conductive strips arranged in parallel with each other on the first major surface of the electrically insulating substrate, a second electrically conductive pattern including a plurality of conductive strips arranged in parallel with each other on the second major surface of the electrically insulating substrate, a first flexible electrically insulating cover provided on the first major surface of the electrically insulating substrate such that said first conductive pattern is covered with the first flexible electrically insulating cover, and a second flexible electrically insulating cover provided on the second major surface of the electrically insulating substrate such that the second conductive pattern is covered with the second flexible electrically insulating cover.

In the flexible printed wiring board according to the invention, a part or all of conductive strips of the first and second conductive patterns may be used as signal lines and the remaining one or more conductive strips are used as ground lines. Therefore, impedance matching for a high frequency signal can be attained easily and a high frequency signal can be transmitted efficiently with a small loss. Furthermore, the first and second conductive patterns are separated in the thickness direction of the flexible printed wiring board, and thus, the amount of signal to be transmitted can be increased in comparison with the conventional flexible printed wring board illustrated in FIG. 2. Moreover, it is not necessary to provide the ground sheet having a large surface area that is provided in the known flexible printed wiring board shown in FIG. 2, and therefore the folding endurance is not substantially decreased.

In a preferred embodiment of the flexible printed wiring board according to the invention, the first and second conductive patterns are provided at such a position viewed in the thickness direction of the wiring board such that the first and second conductive patterns are situated symmetrically on respective sides of a geometrical center line or neutral stress line. In such a symmetrical structure, the folding endurance can be improved in applications in which the flexible printed wiring board in a flat condition is bent both directions. Furthermore, the flexible printed wiring board having a symmetrical structure can be manufactured much more easily.

In another preferred embodiment of the flexible printed wiring board according to the invention, the first and second conductive patterns are arranged asymmetrically with respect to a geometrical center line or neutral stress line toward an inner side of the wiring board under a bent condition when viewed in the thickness direction of the flexible printed wiring board. In this case, it is particularly preferable that both the first and second conductive patterns are situated on the inner side of the geometrical center line or neutral stress line. In such an asymmetrical structure, the portions of the conductive pattern positioned far from the geometrical center line or neutral stress line are subjected to a larger compressive stress upon bending, but it has been confirmed experimentally that folding endurance is less affected by compressive stress.

According to a second aspect of the present invention, a flexible printed wiring board is provided, including first, second and third flexible electrically insulating substrates each having first and second major surfaces, a first electrically conductive pattern including a plurality of conductive strips serving as ground lines arranged in parallel with each other on a first major surface of the first electrically insulating substrate, a second electrically conductive pattern including a plurality of conductive strips serving as signal lines arranged in parallel with each other on a first major surface of the second electrically insulating substrate, a third electrically conductive pattern including a plurality of conductive strips serving as ground lines arranged in parallel with each other on a first major surface of the third electrically insulating substrate, a first adhesive layer cementing the first major surface of the first electrically insulating substrate to a second surface of the second electrically insulating substrate, a second adhesive layer cementing the first major surface of the second electrically insulating substrate to a second surface of the third electrically insulating substrate; a flexible electrically insulating cover, and a third adhesive layer cementing the flexible electrically insulating cover to the first major surface of the third electrically insulating substrate.

In the above-mentioned flexible printed wiring board according to the second aspect of the present invention, the second conductive pattern serving as signal lines is sandwiched between the first and third conductive patterns serving as ground lines, and therefore impedance matching can be attained much more easily. In this case, all the conductive strips of the first, second and third conductive patterns may be aligned in the thickness direction of the wiring board, but it is preferable that the middle second conductive pattern is deviated laterally by a half pitch. Then, undesired fluctuation of impedance can be effectively suppressed.

The flexible printed wiring board according to the invention may have a symmetrical structure, but it is particularly preferable that the first, second and third conductive patterns are arranged asymmetrically with respect to a geometrical center line or neutral stress line of the flexible printed wiring board under a bent condition viewed in the thickness direction of the flexible printed wiring board. That is to say, the first, second and third conductive patterns are deviated or shifted toward an inner side of a geometrical center line or neutral stress line of the flexible printed wiring board under a folded condition. Such an asymmetrical structure can further improve a folding endurance of the conductive patterns.

In the flexible printed wiring board according to the invention, the electrically insulating substrate and flexible electrically insulating cover may be advantageously made of polyimide having a superior electrical insulating property as well as a superior folding endurance, and the conductive pattern may be made of a metal having an extremely high folding endurance such as copper, beryllium copper alloy and phosphor bronze. The conductive pattern may be made of any other electrically conductive material depending upon applications. In any case, it is preferable that the conductive pattern is made of a material having a conductivity which is not less than 1% of the conductivity of pure copper, preferably not less than 5% of the conductivity of pure copper, and more particularly not less than 10% of the conductivity of a pure copper. Furthermore, according to the invention, it is preferable that the impedance of the flexible printed wiring board is set to a value within 50Ω±20%, preferably 50Ω±10%, and more particularly 50Ω±5%.

DETAILED DESCRIPTION OF THE INVENTION

Figure 3:
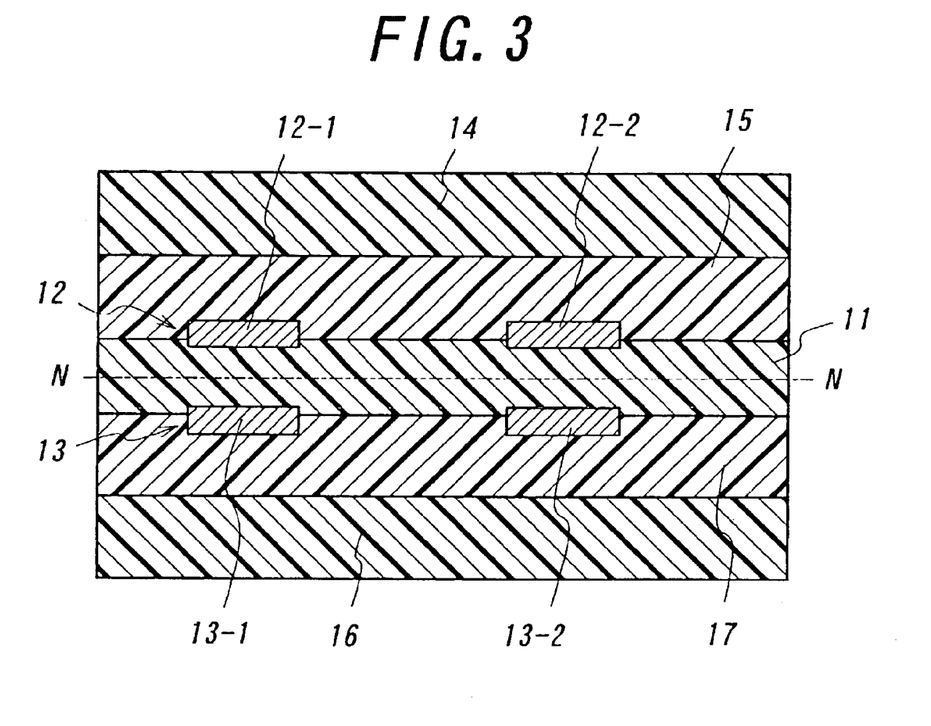
FIG. 3 is a cross sectional view depicting a first embodiment of the flexible printed wiring board having the symmetrical structure according to the invention.

Now, the present invention will be explained in detail with reference to several embodiments shown in the accompanying drawings. FIG. 3 is a cross sectional view illustrating a first embodiment of the flexible printed wiring board according to the invention. In the present embodiment, the flexible printed wiring board is constructed to have the symmetrical structure, in which first and second conductive patterns are arranged symmetrically with respect to a geometrical center line or neutral stress line upon viewed in the thickness direction of the flexible printed wiring board. On a first major surface of a flexible electrically insulating substrate 11 made of polyimide and having a thickness of 25 µm, is provided a first conductive pattern 12 including a plurality of electrically conductive strips 12-1, 12-2—which are arranged in parallel with each other. On a second major surface of the substrate 11, there is provided a second conductive pattern 13 having a plurality of electrically conductive strips 13-1, 13-2—which are arranged in parallel with each other. The conductive strips of these first and second conductive patterns 12 and 13 are made of beryllium copper alloy and have a thickness of 15 µmm, a line width of 80 µm and a spacing of 150 µm.

A first electrically insulating cover 14 is cemented by a thermo-compression bonding using an adhesive layer 15 to the first major surface of the substrate 11 such that the first conductive pattern 12 is covered with the first electrically insulating cover 14. Similarly, a second electrically insulating cover 16 is cemented by thermocompression bonding using an adhesive layer 17 to the second major surface of the substrate 11 such that the second conductive pattern 13 is fully covered with the second electrically insulating cover 16. In the present embodiment, the first and second electrically insulating covers 14 and 16 are made of polyimide and have a thickness of 25 µm, and the adhesive layers 15 and 17 are formed by an adhesive agent of polyimide series and have a thickness of 25 µm. Therefore, the first and second conductive patters 12 and 13 are arranged symmetrically with respect to a geometric center line N—N. In other words, a center line of the electrically insulating substrate 11 coincides with the geometrical center line N—N. Polyimide has a dielectric constant between 3.0–3.5 depending upon the composition, and has excellent folding endurance.

In the present embodiment, the electrically insulating covers 14 and 16 are made of polyimide having a dielectric constant of 3.3. When the flexible printed wiring board is used in applications in which the flexible printed wiring board is repeatedly bent or folded at a high frequency, it is preferable to use an adhesive agent having a high glass-transition temperature due to the heat that is generated at the bent portion. That is to say, the temperature of the adhesive layer is increased by heat generated by repetitive bending, and when the temperature exceeds the glass-transition temperature of the adhesive agent, the adhesive layer is liable to be broken due to a loss of plasticity. In conventional flexible printed wiring boards, the adhesive layer is made of an adhesive agent having a glass-transition temperature of 40–60° C. In the present embodiment, however, the adhesive layer is made of an adhesive agent having a glass-transition temperature not less than 100° C. In this manner, the folding endurance of the flexible printed wiring board according to the invention can be improved by suitably selecting materials of the conductive pattern and adhesive layer.

In the flexible printed wiring board according to the invention, since the first and second conductive patterns 12 and 13 have the same structure, any one of them may be used as signal lines and the other as ground or earth lines. However, as a case may be, a part of the conductive strips of the conductive pattern serving as signal lines may be utilized as ground lines and a part of the conductive strips of the conductive pattern serving as ground lines may be used as signal lines. In any case, the ground lines are provided for respective signal lines, and thus impedance matching can easily and precisely be attained and cross talk between adjacent signal lines can be suppressed sufficiently. In this manner, it is possible to conduct a high frequency signal efficiently through the flexible printed wiring board. Furthermore, the conductive pattern serving as signal lines and the conductive patter serving as ground lines are stacked in the thickness direction of the flexible printed wiring board, and therefore, the amount of signal to be transmitted can be increased twice as compared with the known flexible printed wiring boards shown in FIGS. 1 and 2.

Figure 4:
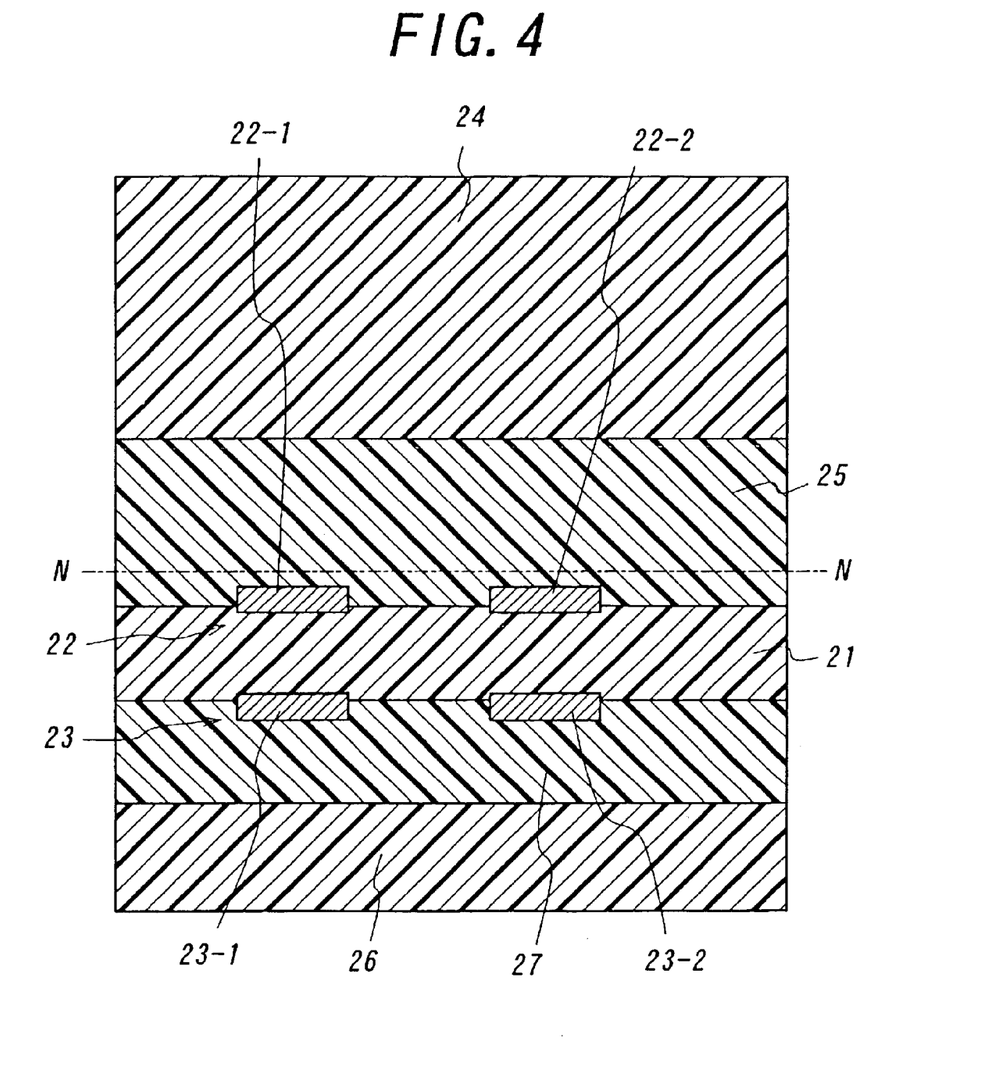
FIG. 4 is a cross sectional view depicting a second embodiment of the flexible printed wiring board having the asymmetrical structure according to the invention.

FIG. 4 is a cross sectional view illustrating a second embodiment of the flexible printed wiring board according to the invention. In the present embodiment, first and second conductive patterns are arranged asymmetrically with respect to the geometrical center line or a neutral stress line N—N by deviating or shifting the conductive patterns toward an inner side of the geometrical center line or neutral stress line of the flexible printed wiring board under a bent condition. In the embodiment shown in FIG. 4, the conductive patterns are shifted in a lower direction in the drawing of FIG. 4 with respect to the geometrical center line or neutral stress line N—N. Also in the present embodiment, a first conductive pattern 22 including a plurality of electrically conductive strips 22-1, 22-2—arranged in parallel with each other is provided on a first major surface of a flexible electrically insulating substrate 21 made of polyimide and having a thickness of 25 $\mu$m, and a second conductive pattern 23 having a plurality of electrically conductive strips 23-1, 23-2—arranged in parallel with each other is provided on a second major surface of the substrate 21. The conductive strips of these first and second conductive patterns 22 and 23 are made of beryllium copper alloy and have a thickness of 15 $\mu$m, a line width of 80 $\mu$m and a spacing of 150 $\mu$m.

A first electrically insulating cover 24 is secured by a thermo-compression bonding using an adhesive layer 25 to the first major surface of the substrate 21 such that the first conductive pattern 22 is covered with the first electrically insulating cover 24. Similarly, a second electrically insulating cover 26 is cemented by thermocompression bonding using an adhesive layer 27 to the second major surface of the substrate 21 such that the second conductive pattern 23 is covered with the second electrically insulating cover 26. In the present embodiment, the first electrically insulating cover 24 is formed by a polyimide sheet having a thickness of 50 $\mu$m and the adhesive layer 25 is made of an adhesive agent of polyimide series and has a thickness of 35 $\mu$m. The second electrically insulating cover 26 is formed by a polyimide sheet having a thickness of 25 $\mu$m and the adhesive layer 27 is formed by an adhesive agent of polyimide series and has a thickness of 25 $\mu$m.

In the structure mentioned above, the stress neutral line N—N viewed in a direction of a thickness of the flexible printed wiring board is situated at a position which is slightly above the first conductive pattern 22. That is to say, the first and second conductive patterns 22 and 23 are situated on an inner side of the stress neutral line N—N of the flexible printed wiring board which is bent into a reversed U shape. It has been experimentally confirmed that such an asymmetrical structure can improve the folding endurance to a great extent, because both the first and second conductive patterns 22 and 23 are subjected to compressive stress. Also, in the present embodiment, any one of the first and second conductive patterns 22 and 23 may be used as signal lines and the other as ground or earth lines, and therefore impedance matching can be attained easily and precisely. Furthermore, since the conductive pattern serving as signal lines and the conductive patter serving as ground lines are stacked in a direction of a thickness of the flexible printed wiring board, an amount of signal to be transmitted can be increased twice as compared with the known flexible printed wiring boards shown in FIGS. 1 and 2.

Figure 5:
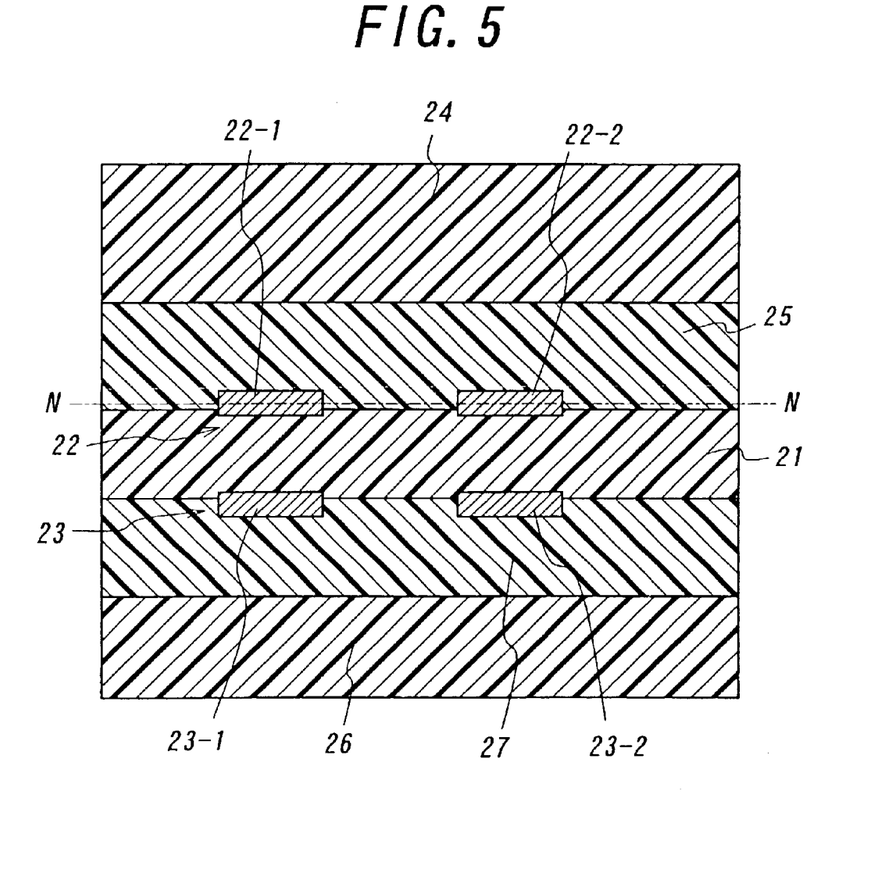
FIG. 5 is a cross sectional view depicting a third embodiment of the flexible printed wiring board having the asymmetrical structure according to the invention.

FIG. 5 is a cross sectional view illustrating a third embodiment of the flexible printed wiring board according to the invention. Like as the second embodiment shown in FIG. 4, the flexible printed wiring board of the present invention has the asymmetrical structure, in which first and second conductive patterns are shifted or deviated toward an inner side of the stress neutral line N—N of the flexible printed wiring board under a folded condition viewed in a direction of a thickness of the flexible printed wiring board. The flexible printed wiring board according to the present embodiment is constructed such that the stress neutral line N—N passes through the first conductive pattern. A first conductive pattern 22 is arranged on a first major surface of a flexible electrically insulating substrate 21 formed by a polyimide sheet having a thickness of 25 $\mu$m, and a second conductive pattern 23 is arranged on a second major surface of the substrate 21. Also in the present embodiment, electrically conductive strips 22-1, 22-2—of the first conductive pattern 22 and electrically conductive strips 23-1, 23-2—of the second conductive pattern 23 are made of a beryllium copper alloy having a thickness of 15 $\mu$m and have a line width of 80 $\mu$m and a spacing of 150 $\mu$m.

A first electrically insulating cover 24 covering the first conductive pattern 22 is formed by a polyimide sheet having a thickness of 35 $\mu$m, and an adhesive layer 25 securing the first electrically insulating cover 24 to the first major surface of the substrate 21 by thermocompression bonding is made of an adhesive agent of polyimide series and has a thickness of 30 $\mu$m. A second electrically insulating cover 26 is formed by a polyimide sheet having a thickness of 25 $\mu$m, and an adhesive layer 27 securing the second electrically insulating cover 26 to the second major surface of the substrate 21 by thermocompression bonding is made of an adhesive agent of polyimide series and has a thickness of 25 $\mu$m. By constructing the flexible printed wiring board in the manner mentioned above, when the flexible printed wiring board in the drawing of FIG. 5 is bent into a reverse U-shape, the stress neutral line N—N is shifted toward the inner side of the bending, i.e. downward in the drawing of FIG. 5 as compared with the embodiment shown in FIG. 4, and the stress neutral line N—N passes through the first conductive pattern 22.

In the asymmetrical structure illustrated in FIG. 5, the first conductive pattern 22 is subjected not only to a compressive force, but also to a tensile force. However, since the stress neutral line N—N is situated at the first conductive pattern 22, when the flexible printed wiring board is bent, both the compressive force and tensile force are small, and therefore high folding endurance is maintained. Moreover, since the second conductive pattern 23 becomes closer to the stress neutral line N—N compared with the second embodiment shown in FIG. 4, the compressive force subjected to the second conductive pattern becomes smaller upon bending. In this manner, the folding endurance of the third embodiment of the flexible printed wiring board is much more improved. It is a matter of course that the impedance matching for a high frequency signal can be attained easily and precisely and a larger amount of signal can be transmitted with a small loss. In a modification of the present embodiment, the first conductive pattern 22 is situated slightly above the stress neutral line N—N. Also in such an asymmetrical structure, a compressive force applied to the first conductive pattern 22 is small, and thus a high folding endurance can be still attained.

Figure 6:
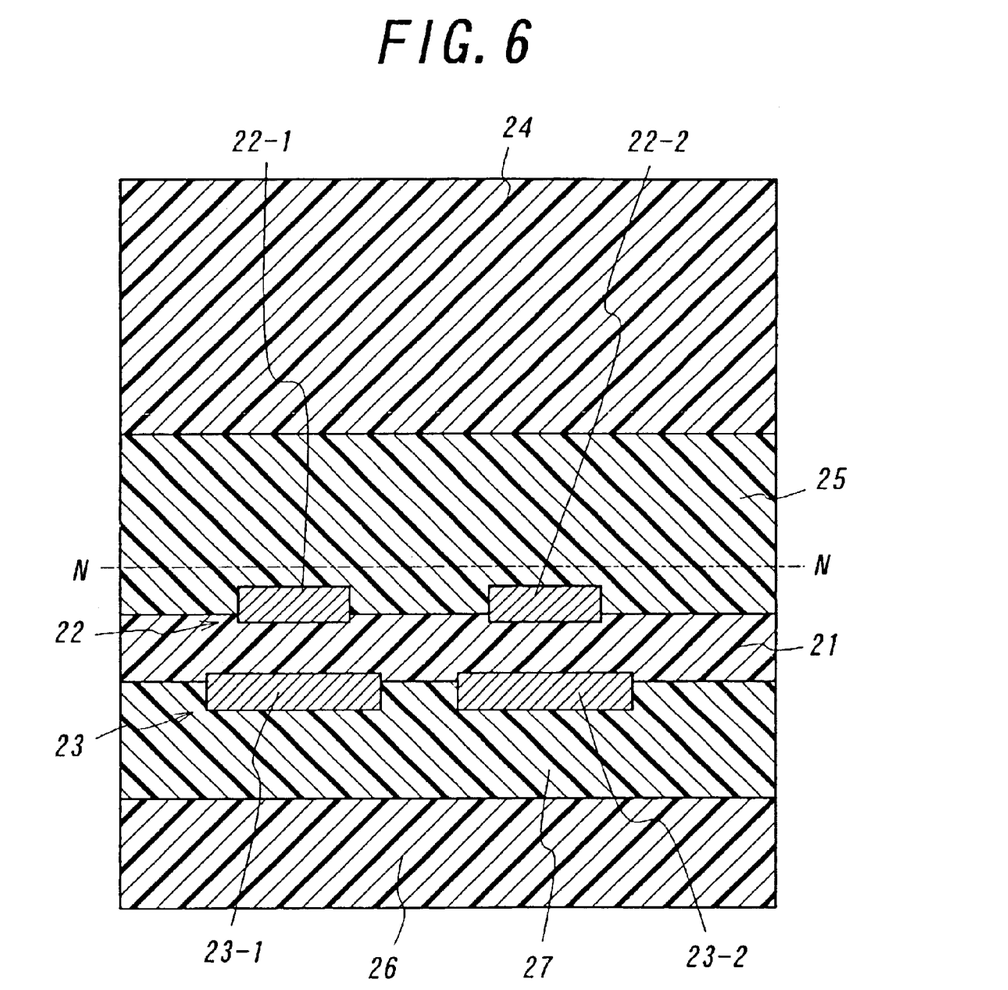
FIG. 6 is a cross sectional view showing a fourth embodiment of the flexible printed wiring board having the asymmetrical structure according to the invention, in which conductive strips serving as ground lines have a wider line width.

FIG. 6 is a cross sectional view depicting a fourth embodiment of the flexible printed wiring board according to the invention. A principal structure of the present embodiment is identical with that of the second embodiment illustrated in FIG. 4. Therefore, only portions different from the second embodiment will be explained. In the second embodiment, all the electrically conductive strips of the first and second conductive patterns 22 and 23 have a same line width, but in the present embodiment, the line width of the electrically conductive strips 23-1, 23-2—of the second conductive pattern 23 which are situated far from the neutral stress line N—N is larger than that of the electrically conductive strips 22-1, 22-2—of the first conductive pattern 22 which are closer to the neutral stress line N—N. It should be noted that the second conductive pattern 23 including the conductive strips 23-1, 23-2—having a larger line width may be used as ground lines and the first conductive pattern 22 including the conductive strips 22-1, 22-2—having a smaller line width may be used as signal lines. Alternatively the second conductive pattern 23 having the wide conductive strips 23-1, 23-2—may be used as signal lines and the first conductive pattern 22 having the narrow conductive strips 22-1, 22-2—may be used as ground lines. In any case, a fluctuation in the impedance can be suppressed and the precise impedance matching can be realized.

Now, a stress, in the present embodiment compressive stress subjected to the conductive pattern upon bending the flexible printed wiring board will be considered. It is assumed that displacement, Young's modulus, thickness and line width of the electrically conductive strip are denoted by δ, E, t and W, respectively. Then, compressive stress F may be expressed by the following equation (1):

$$F = \frac{3\delta Et}{2W^2} \quad (1)$$

As can be understood from the equation (1), the compressive stress F becomes smaller in accordance with an increase in the line width W of the conductive strip. Therefore, it is preferable that the conductive strips 23-1, 23-2—of the second conductive pattern situated far from the neutral stress line N—N have a larger line width than the conductive strops 22-1, 22-2—of the first conductive pattern situated closer to the neutral stress line N—N.

If it is assumed that the electrically conductive strips of the first and second conductive patterns 22 and 23 have the same pitch, the spacing between successive conductive strips 23-1, 23-2—of the second conductive pattern 23 of the fourth embodiment shown in FIG. 6 is smaller than that of the first conductive pattern 22. As explained above, the conductive pattern is formed by the photolithography using an etching solution, and thus if the spacing between successive conductive strips is too narrow, it is no longer possible to form the conductive pattern precisely. According to the presently available photolithography technique, a spacing between successive conductive strips that was larger than about 80 μm could not be formed accurately. Therefore, in the present embodiment, the second conductive pattern 23 has a line width of 150 μm and a space of 80 μm. It should be noted that this spacing value is not inherent to the present invention, and the width of the spacing will be much more reduced in accordance with a progress of the manufacturing technique.

Figure 7:
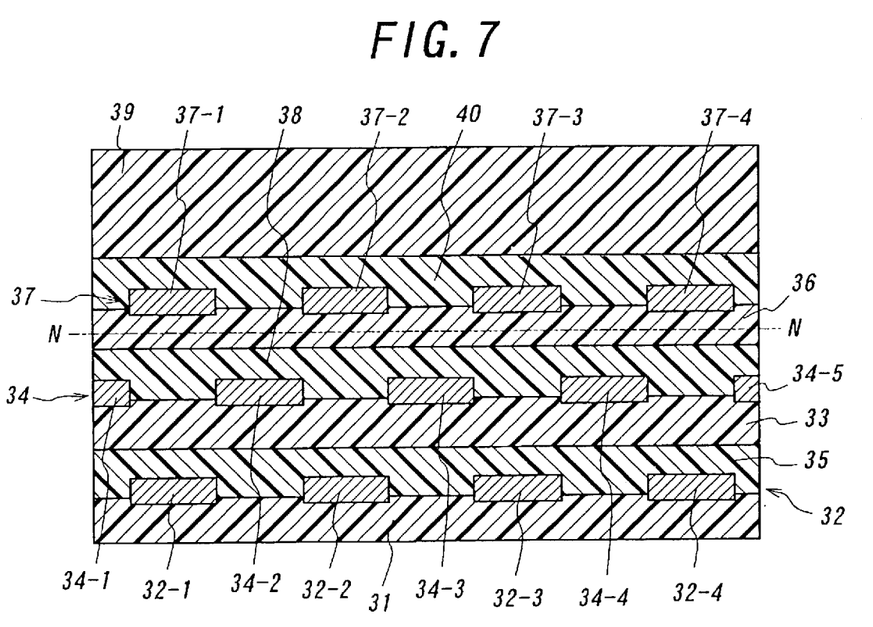
FIG. 7 is a cross sectional view showing a fifth embodiment of the flexible printed wiring board having the asymmetrical structure according to the invention, in which signal lines are interposed between ground lines.

FIG. 7 is a cross sectional view showing a fifth embodiment of the flexible printed wiring board according to the invention. In the present embodiment, a conductive pattern serving as signal line is sandwiched between a pair of conductive patterns serving as ground line. On a first major surface of a first flexible electrically insulating substrate 31 formed by a polyimide sheet having a thickness of 25 μm, is provided a first conductive pattern 32 including a plurality of electrically conductive strips 32-1, 32-2—arranged in parallel with each other. In the present embodiment, these electrically conductive strips 32-1, 32-2—are used as ground lines. On a first major surface of a second flexible electrically insulating substrate 33 formed by a polyimide sheet having a thickness of 25 μm, is provided a second conductive pattern 34 including a plurality of electrically conductive strips 34-1, 34-2—arranged in parallel with each other. In the present embodiment, these electrically conductive strips 34-1, 34-2—are used as signal lines. A second major surface of the second substrate 33 is cemented by thermocompression bounding to the first surface of the first substrate 31 by means of an adhesive layer 35 having a thickness of 25 μm, and thus the first conductive pattern 32 is fully covered with the second substrate 33.

On a first major surface of a third flexible electrically insulating substrate 36 formed by a polyimide sheet having a thickness of 25 μm, is provided a third conductive pattern 37 including a plurality of electrically conductive strips 37-1,37-2—arranged in parallel with each other. These electrically conductive strips 37-1, 37-2—are used as ground lines. A second major surface of the third substrate 36 is cemented by thermocompression bonding to the first surface of the second substrate 33 by means of an adhesive layer 38 having a thickness of 25 μm such that the second conductive pattern 34 is fully covered with the third substrate 36. Finally, an electrically insulating cover 39 having a thickness of 50 μm is cemented by thermocompression bonding using an adhesive layer 40 having a thickness of 25 μm to the first major surface of the third substrate 36 such that the third conductive pattern 37 is covered with the electrically insulating cover 39.

In the present embodiment, as illustrated in FIG. 7, the electrically conductive strips 32-1, 32-2—and 37-1, 37-2—of the first and third conductive patterns 32 and 37 serving as ground lines are aligned in the thickness direction of the flexible printed wiring board, but the electrically conductive strips 34-1, 34-2—of the second conductive pattern 34 serving as signal lines are shifted laterally by a half pitch such that they are situated at middle points between successive conductive strips of the first and third conductive patterns 32 and 37. In the present embodiment, the conductive strips of the first, second and third conductive patterns 32, 34 and 37 are made of beryllium copper alloy and have a thickness of 15 μm, a line width of 100 μm and a spacing of 100 μm.

As explained above, in the flexible printed wiring board of the present embodiment, the second conductive pattern 34 serving as signal lines is arranged between the first and third conductive patterns serving as ground lines such that the second conductive pattern 34 is shifted laterally by a half pitch with respect to the first and third conductive patterns 32 and 37. Therefore, impedance matching can be attained much more easily and precisely. However, according to the invention, the first, second and third conductive patterns 32, 34 and 37 may be aligned in the thickness direction of the flexible printed wiring board. Even in this case, impedance matching can be attained easily and precisely compared with the known flexible printed wiring boards. Furthermore, the flexible printed wiring board of the present embodiment has the asymmetrical structure and the stress neutral line N—N passes substantially through a center line of the third substrate 36. However, according to the invention, the flexible printed wiring board may have a symmetrical structure in which the stress neutral line N—N passes substantially through a center line of the second conductive pattern 34.

Now, the performance of the flexible printed wiring board according to the present invention will be explained in comparison with the conventional flexible printed wiring boards. Several samples of the novel flexible printed wiring board according to the present invention and several samples of the conventional flexible printed wiring board shown in FIG. 1 were formed and a folding endurance test was performed. In this case, both the IPC folding endurance test and MIT folding endurance test were conducted. In the former IPC folding endurance test, one end of a sample is fixed to a stationary member and the other end of the sample is secured to a sliding member, and the sample is bent repeatedly by reciprocally moving the sliding member over a given distance. Then, the number of bending operations is counted until the sample is broken down. In the later MIT flexible test, one end of a sample is clamped by a rotating member and the other end of the sample is secured to a stationary member. Then, the number of bending operations caused by reciprocally rotating the rotating member is counted until the sample is broken down. The sample is held such that a free portion of the sample becomes 50–70 μm, and the bending operation is carried out at a bending speed of 90 rpm, a bending angle of about 135° and a bending radius of 2–4 μm.

Figure 8:
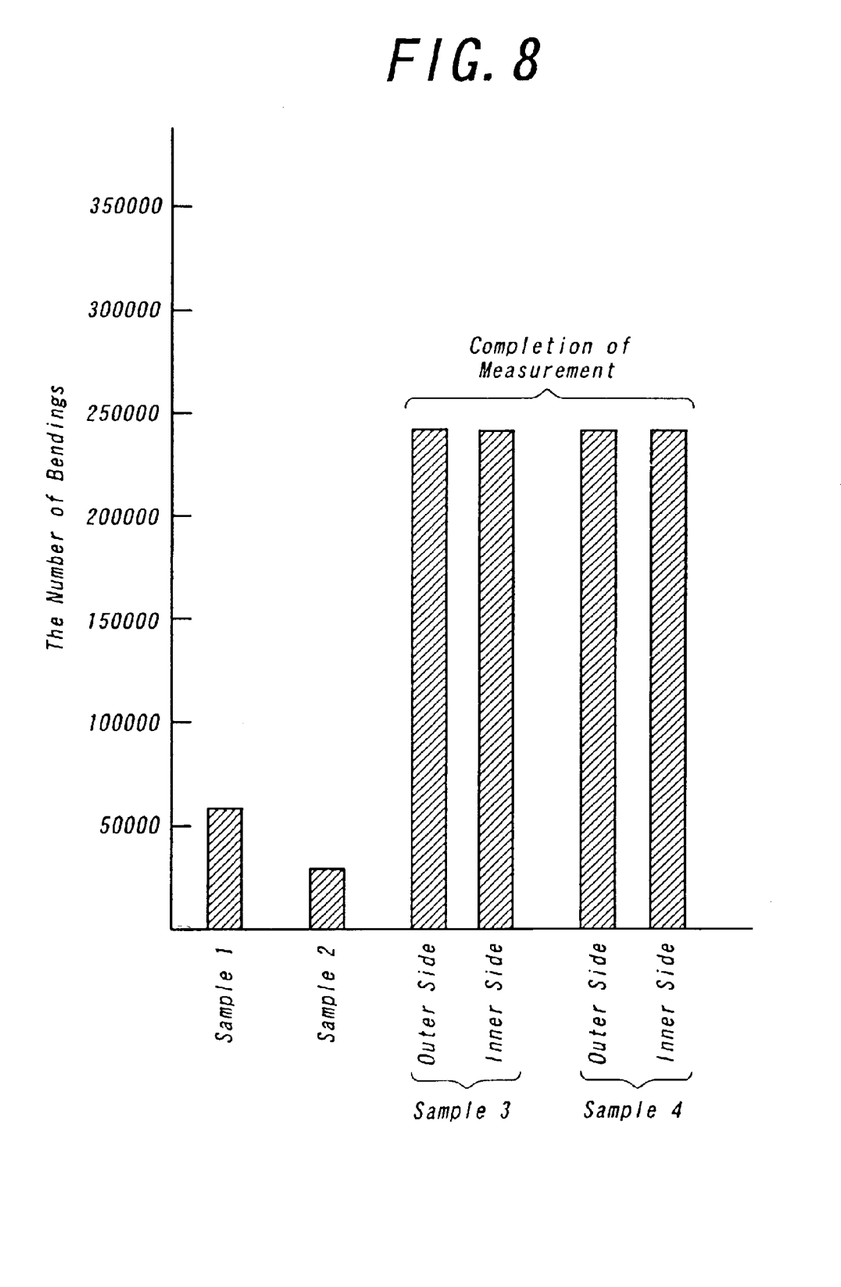
FIG. 8 is a graph representing the property of the flexible printed wiring board according to the invention in comparison with conventional flexible printed wiring boards.

FIG. 8 is a graph showing a result of the IPC folding endurance test. Samples 1 and 2 have the conventional structure of the known flexible printed wiring board shown in FIG. 1 and have conductive patterns manufactured by etching copper foils formed by electrolytic plating. Electrically insulating members of the samples 1 and 2 are made of a same polyimide, but the etching process is different from each other. The samples 1 and 2 having the conventional structure are broken down after less than 60,000 times of bending. Samples 3 and 4 have the asymmetrical structure according to the invention shown in FIG. 4. Both the first and second conductive patterns 22 and 23 are not broken down even after 240,000 times of bending, in which the first conductive pattern 22 becomes an outer side conductive pattern and the second conductive pattern becomes an inner side conductive one. The test result shown in FIG. 8 does not denote that the samples 3 and 4 break down at 240,000 times of bending, but instead shows that they are not broken down even after 240,000 times of bending. In the graph, this is represented as "completion of measurement." In this manner, it has been experimentally that the flexible printed wiring board according to the invention has a superior folding endurance, i.e. flexibility.

Figure 9:
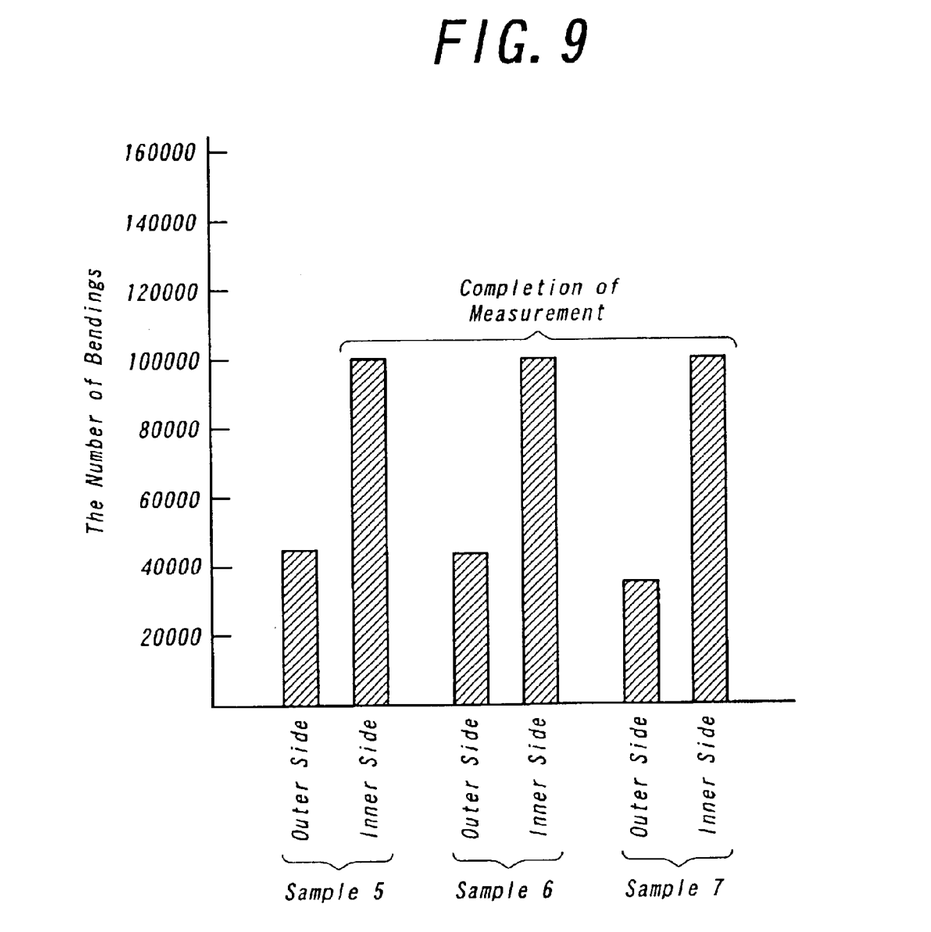
FIG. 9 is a graph showing the folding endurance of the flexible printed wiring board according to the invention.

FIG. 9 is a graph showing a result of the IPC folding endurance test using samples 5, 6 and 7 of the flexible printed wiring board having the symmetrical structure according to the invention illustrated in FIG. 3. In this test, the influence of the compressive force and tensile force to the conductive pattern was examined. In all the samples 5, 6 and 7, outer conductive patterns broken down after 50,000 times of bending, while inner conductive patterns did not break down even after 100,000 times of bending. From this result, it has been found that the tensile force has a larger influence upon the folding endurance than the compressive force. Therefore, according to the invention, it is preferable to adopt the asymmetrical structure shown in FIGS. 4 and 5, in which the first and second conductive patterns are deviated toward the inner side with respect to the stress neutral line N—N. Then, an extremely superior folding endurance can be attained.

As explained above, in the flexible printed wiring board according to the invention shown in FIGS. 4–6, the first and second conductive patterns are deviated toward the inner side with respect to the stress neutral line of the flexible printed wiring board under a bent condition, and therefore the extremely high folding endurance can be obtained. Furthermore, ground lines are provided in addition to the signal lines, and therefore the impedance matching for the high frequency signal can be attained easily and accurately and an amount of signal to be transmitted can be increased twice of that of the known flexible printed wiring board shown in FIG. 2. Moreover, upon comparing the conventional flexible printed wiring board depicted in FIG. 2, the flexible printed wiring board according to the invention has a simpler structure and can be manufactured easily at a low cost. In this manner, the present invention can provide the novel and useful flexible printed wiring board having a higher performance, a higher integration density and a lower cost.

Several samples of the flexible printed wiring board according to the invention having the structures shown in FIGS. 3–7 were manufactured and the impedance measurement was conducted. Impedance of samples having the structures illustrated in FIGS. 3–5 is 45–55Ω, and impedance of samples having the structures depicted in FIGS. 6 and 7 is 46–53Ω. According to the invention, it is preferable that an impedance is within a range of 50Ω±20%, preferably 50Ω±10%, and more particularly 50Ω±5%.

The present invention is not limited to the embodiments just explained above, but many alternations and modifications may be conceived by a person skilled in the art with the scope defined by the claims. For instance, various sizes of the above mentioned embodiments are denoted only for the sake of examples and may be changed in accordance with particular applications. Moreover, in the above embodiments, the electrically conductive pattern is made of beryllium copper alloy, but it may be made of any other metal having a high folding endurance such as rolled copper foil and phosphor bronze. It is a matter of course that the conductive pattern may be formed by an electrolytic plating film of copper generally used in the conventional flexible printed wiring boards. It should be noted that the conductivity of the beryllium copper alloy changes in accordance with a composition. Now, it is assumed that the conductivity of a pure copper is 100%. Then, the conductivity of 11 alloy is 50–60%, and the conductivity of 25 alloy (C1720) is 18–25%. A phosphor bronze C5210 has a conductivity of 8% and the conductivity of a rolled copper foil is 90–105%. According to the present invention, it is preferable that the conductive pattern is made of a material having a conductivity which is not less than 1% of the conductivity of pure copper, preferably not less than 5%; and more particularly not less than 10% of the conductivity of pure copper. Furthermore, according to the present invention, a conductive pattern to which a larger stress is applied may be made of a material having a higher folding endurance, such as a beryllium copper alloy, and a conductive pattern to which a smaller stress is applied may be made of a material having a higher conductivity (for instance, a rolled copper foil having a higher conductivity and a lower folding endurance).

In the above embodiments, the electrically insulating substrates, electrically insulating covers and electrically insulating adhesive layers are made of polyimide, but according to the invention, they may be made of another material having a good electrically insulating property as well as a sufficiently high flexibility.

In the embodiments illustrated in FIGS. 4–6 having the asymmetrical structure in which the first and second conductive patterns are deviated toward the inner side with respect to the neutral stress line viewed in a direction of a thickness of the flexible printed wiring board upon bending. In general, the neutral stress line substantially coincides with the geometrical center line, and thus the first and second conductive patterns may be deviated toward the inner side with respect to the geometrical center line.

The embodiment illustrated in FIG. 7 has an asymmetrical structure in which the second conductive pattern serving as the signal lines is deviated toward the inner side with respect to the neutral stress line viewed in the thickness direction of the flexible printed wiring board upon bending. However, according to the invention, the flexible printed wiring board may have a symmetrical structure in which the second conductive pattern is arranged on the neutral stress line or geometrical center line.

What is claimed is:

1. A flexible printed wiring board comprising:
   a flexible electrically insulating substrate having first and second major surfaces and including a plurality of conductive patterns;
   a first electrically conductive pattern including a plurality of conductive strips arranged in parallel with each other and provided on said first major surface of said electrically insulating substrate;
   a second electrically conductive pattern including a plurality of conductive strips arranged in parallel with each other and provided on said second major surface of said electrically insulating substrate;
   a first flexible electrically insulating cover provided on said first major surface of said electrically insulating substrate such that said first conductive pattern is covered with said first flexible electrically insulating cover; and
   a second flexible electrically insulating cover provided on said second major surface of said electrically insulating substrate such that said second conductive pattern is covered with said second flexible electrically insulating cover;
   wherein all of said plurality of conductive patterns, including said first and second conductive patterns, are situated asymmetrically on a side of a geometrical center line and a neutral stress line when viewed in the thickness direction of said flexible printed wiring board, such that said side is an inner side when said flexible printed wiring board is bent.

2. The flexible printed wiring board according to claim 1, wherein said electrically conductive strips of said first and said second conductive patterns have identical line widths and spacing.

3. The flexible printed wiring board according to claim 2, wherein said electrically conductive strips of said first and said second conductive patterns are aligned in a thickness direction of said flexible printed wiring board.

4. The flexible printed wiring board according to claim 1, wherein a width of one of said first and said second conductive patterns situated distant from said geometrical center line and said neutral stress line is larger than a width of the other one of said first and said second conductive patterns situated closer to said geometrical center line and said neutral stress line.

5. The flexible printed wiring board according to claim 1, wherein both said first and said second conductive patterns are fully situated on an inner side of said geometrical center line and said neutral stress line.

6. The flexible printed wiring board according to claim 5, wherein a width of said second conductive pattern, situated distant from said geometrical center line and said neutral stress line, is larger than a width of said first conductive pattern situated closer to said geometrical center line and said neutral stress line.

7. The flexible printed wiring board according to claim 1, wherein said electrically insulating substrate and said first and said second electrically insulating covers comprise polyimide.

8. The flexible printed wiring board according to claim 1, wherein said first and said second electrically conductive patterns comprise an electrically conductive material selected from the group consisting of rolled copper, beryllium copper alloy and phosphor bronze.

9. The flexible printed wiring board according to claim 1, wherein said first and said second electrically conductive patterns comprise an electrically conductive material having a conductivity of not less than 1% of the conductivity of pure copper.

10. The flexible printed wiring board according to claim 9, wherein said first and said second electrically conductive patterns comprise an electrically conductive material having a conductivity of not less than 5% of the conductivity of pure copper.

11. The flexible printed wiring board according to claim 10, wherein said first and second electrically conductive patterns comprise an electrically conductive material having a conductivity of not less than 10% of the conductivity of pure copper.

12. The flexible printed wiring board according to claim 1, wherein said flexible printed wiring board has an impedance within a range of $50\Omega \pm 20\%$.

13. The flexible printed wiring board according to claim 12, wherein said flexible printed wiring board has an impedance within a range of $50\Omega \pm 10\%$.

14. The flexible printed wiring board according to claim 13, wherein said flexible printed wiring board has an impedance within a range of $50\Omega \pm 5\%$.

15. A flexible printed wiring board comprising:
   first, second and third flexible electrically insulating substrates each having a respective first major surface and a respective second major surface;
   a first electrically conductive pattern including a plurality of conductive strips serving as ground lines arranged in parallel with each other on said first major surface of said first electrically insulating substrate;
   a second electrically conductive pattern including a plurality of conductive strips serving as signal lines arranged in parallel with each other on said first major surface of said second electrically insulating substrate;
   a third electrically conductive pattern including a plurality of conductive strips serving as ground lines arranged in parallel with each other on said first major surface of said third electrically insulating substrate;
   a first adhesive layer cementing said first major surface of said first electrically insulating substrate to said second major surface of said second electrically insulating substrate;
   a second adhesive layer cementing said first major surface of said second electrically insulating substrate to said second major surface of said third electrically insulating substrate;
   a flexible electrically insulating cover; and
   a third adhesive layer cementing said flexible electrically insulating cover to said first major surface of said third electrically insulating substrate.

16. The flexible printed wiring board according to claim 15, wherein said electrically conductive strips of said first, said second and said third conductive patterns have identical line widths and spacing.

17. The flexible printed wiring board according to 15, wherein said electrically conductive strips of said first and said third conductive patterns are aligned in the thickness direction of said flexible printed wiring board and said electrically conductive strips of said second conductive pattern are laterally shifted by a half pitch.

18. The flexible printed wiring board according to claim 15, wherein said first, said second and said third conductive patterns are situated asymmetrically on a side of a geometrical center line or a neutral stress line when viewed in thickness direction of said flexible printed wiring board, such that said side is an inner side when said flexible printed wiring board is bent.

19. The flexible printed wiring board according to claim 15, wherein said electrically insulating substrate and said electrically insulating cover comprise polyimide.

20. The flexible printed wiring board according to claim 15, wherein said first, said second and said third electrically conductive patterns each comprise an electrically conductive material selected from the group consisting of rolled copper, beryllium copper alloy and phosphor bronze.

21. The flexible printed wiring board according to claim 15, wherein said first, said second and said third electrically conductive patterns each comprise an electrically conductive material having a conductivity of not less than 1% of the conductivity of pure copper.

22. The flexible printed wiring board according to claim 21, wherein said first, said second and said third electrically conductive patterns each comprise an electrically conductive material having a conductivity of not less than 5% of the conductivity of pure copper.

23. The flexible printed wiring board according to claim 22, wherein said first, said second and said third electrically conductive patterns each comprise an electrically conductive material having a conductivity of not less than 10% of the conductivity of pure copper.

24. The flexible printed wiring board according to claim 15, wherein said flexible printed wiring board has an impedance within a range of $50\Omega \pm 20\%$.

25. The flexible printed wiring board according to claim 24, wherein said flexible printed wiring board has an impedance within a range of $50\Omega \pm 10\%$.

26. The flexible printed wiring board according to claim 25, wherein said flexible printed wiring board has an impedance within a range of $50\Omega \pm 5\%$.

* * * * *